United States Patent
Butler

(10) Patent No.: US 6,989,684 B2
(45) Date of Patent: Jan. 24, 2006

(54) SYSTEM FOR AND METHOD OF ASSESSING CHIP ACCEPTABILITY AND INCREASING YIELD

(75) Inventor: Richard M. Butler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 341 days.

(21) Appl. No.: 10/309,967

(22) Filed: Dec. 4, 2002

(65) Prior Publication Data

US 2004/0108867 A1 Jun. 10, 2004

(51) Int. Cl.
*G01R 31/26* (2006.01)

(52) U.S. Cl. ...................................... 324/765
(58) Field of Classification Search ............... 324/765, 324/761, 763, 764, 158.1, 523, 527, 750, 324/674, 760

See application file for complete search history.

(56) References Cited

U.S. PATENT DOCUMENTS

| | | | |
|---|---|---|---|
| 5,130,645 A | * | 7/1992 | Levy .................... 324/158.1 |
| 6,067,651 A | | 5/2000 | Rohrbaugh et al. |
| 6,351,134 B2 | * | 2/2002 | Leas et al. .................. 324/765 |
| 6,370,676 B1 | | 4/2002 | Hayashi et al. |

* cited by examiner

*Primary Examiner*—Michael Tokar
*Assistant Examiner*—Trung Q. Nguyen

(57) ABSTRACT

The present invention includes a method for testing a chip, comprising the steps of measuring power drawn by the chip, calculating a test frequency using the measured power drawn by the chip, and determining performance of the chip at the calculated test frequency. The present invention also includes a system for testing a chip including a first sensor to measure power drawn by the chip, a controller to calculate a test frequency using the measured power drawn by the chip, and a second sensor to measure speed of the chip at the calculated test frequency.

22 Claims, 2 Drawing Sheets

SYSTEM FOR AND METHOD OF ASSESSING CHIP ACCEPTABILITY AND INCREASING YIELD

FIELD OF THE INVENTION

The present invention generally relates to testing electronic circuit chips, and more particularly to predicting the performance of electronic circuit chips.

DESCRIPTION OF RELATED ART

Typically, manufactured electronic circuits, devices and semiconductor products (collectively referred to as "chips") are tested prior to sale to assess whether they operate within specified parameter values. In particular, chips are typically tested using the most harsh operating parameter values, e.g., frequencies, voltages, temperatures, etc., that are specified for the particular design for the type of chips, or chip model. Unavoidable manufacturing variations, such as in doping and conductor line widths, result in chips having a range of operating speeds, that will be below, at, or above a value specified for the chip model. This situation results in tested chips having to be characterized within so-called bins depending on whether, for example, they tested as having fast or slow operating speeds. Fast chips provide purchasers with more performance and can be sold at higher prices than so-called low speed chips.

Chips are tested utilizing prior pre-determined values as the test parameters for the chip model being tested. These input test parameter values are selected to stress test the chips to determine whether they will operate at specified parameter values for the chip model. Such parameters for testing include, values for frequencies, voltages, and temperatures. Accordingly, each chip is tested with a set of test parameter values established for the chip model without adjustment for the unique operating characteristics may be unique for a particular chip being tested.

BRIEF SUMMARY OF THE INVENTION

An embodiment of the present invention includes a method for testing a chip, comprising the steps of measuring power drawn by the chip, calculating a test frequency using the measured power drawn by the chip, and determining performance of the chip at the calculated test frequency.

Another embodiment of the present invention includes a system for testing a chip, comprising a first sensor to measure power drawn by the chip, a controller to calculate a test frequency using the measured power drawn by the chip, and a second sensor to measure speed of the chip at the calculated test frequency.

DETAILED DESCRIPTION

Figure 1:
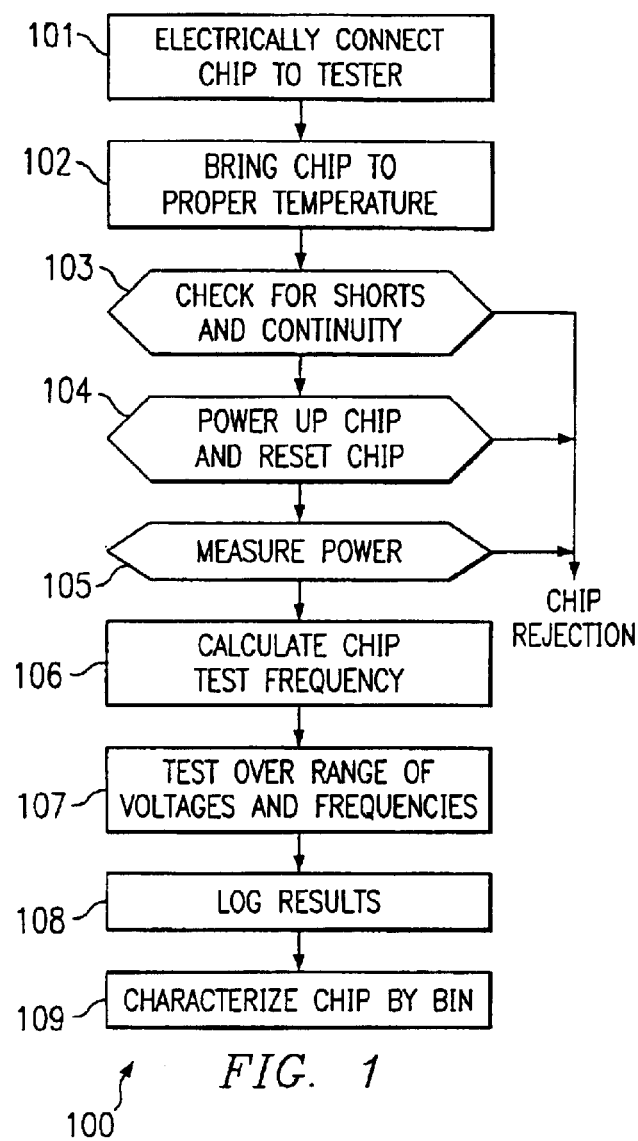
FIG. 1 shows a flow chart block diagram for a chip test system and method according to an embodiment for the invention.

Referring now to FIG. 1, a flow chart block diagram 100 for an embodiment of the invention is shown for a process of a test system for determining whether electronic circuits, devices and semiconductor products operate at specified performance levels. The present invention is applicable to testing circuits such as integrated circuit chips, including processors. Chips to be tested can be one of more chips of a plurality of chips formed on a semiconductor material wafers with the individual chips, also known as die, having adjacent pads for making electrical connections to chip circuits (not shown). Chips to be tested can also be individually packaged chips with pins extending from the packages or pads on the packages for making electrical connections (not shown). In the case of multiple chips or die being set out on semiconductor wafers, the test system may utilize known chucks, or other devices to hold the semiconductor wafers. Associated with these chucks or other holding devices are contacts for making electrical connections for individual chips using pads (not shown). In the case of testing individually packaged chips, the test system may utilize known sockets (not shown) for mounting packaged chips and for making electrical connections.

As illustrated in FIG. 1 the shown embodiment for the invention commences with electrical connections being made between the test system and a chip being tested (block 101). These connections either can be made by automation or by hand.

With the chip electrically connected, the chip temperature next is raised or lower to a predetermined testing temperature (block 102), which often is set at the highest (or lowest) rated chip specification temperature for use in chip purchaser applications. Many times these temperatures are in the range of 70–90 degrees centigrade (° C.).

Electrical short and continuity checks for the chip under test are made to determine if the test system has effective electrical conductivity with the chip and to determine if any chip pads are shorted (block 103). Typically all connections to chips are close and not open. Connections to non-functional circuitry of the chip are typically made to a circuit such as an electrostatic discharge protection device. Therefore, the test system can apply non-damaging voltages to every chip connection and determine if expected currents are drawn. Chips having major manufacturing defects, such as shorts or continuity failures, are rejected and those not having shorts or continuity failures are then powered up (block 104).

In addition to providing a specified powering up voltage to the chip, the test system typically provides a reset signal and a clock frequency to the chip during powering up. Reset signals often are provided to chips having multiple nodes, because when such chip are powered up without a reset signal, they can be randomly initialized where competing pathways are energized. This would potentially damage the chip. Application of a reset signal should properly initialize a chip for being powered up. Chips are rejected that are found not to be properly initialized upon being provided with a reset signal.

After being powered up and reset, the amount of power that the chip under test is drawing is measured (block 105). Many processor chips typically require 50–60 watts to operate. Again, a manufacturing defect can result in a chip drawing excessive power well beyond specified amounts. High power consumption chips can be rejected if they draw more power than specified power supplies for chip purchaser applications can provide.

The amount of power drawn by the chip under test is measured and used to calculate a specific test frequency for that particular chip (block 106). In many instances, this calculated test frequency is not equal to the specified chip model operational frequency. As a first matter, test frequencies often are not equal to specified operational frequencies because there are electrical environmental differences between testers and chip purchaser applications. Also, chips must be quickly tested, and yet must be capable of operating effectively for years in chip purchaser applications. In addition, there also are other reasons for differences between test frequencies and operational frequencies. These reasons include differences in the operating characteristics due to manufacturing differences, such as unavoidable implantation variations, line width variations, etc., between produced chips. Consequences of differences between chips are typically reflected in different operating frequencies (speeds) and amounts of power drawn.

The present invention addresses unavoidable chip operating variations by utilizing a measurement of power drawn for each chip in combination with other operating parameter values determined for the chip model to calculate a test frequency unique for the chip under test. These operating parameter values, other than the individual power drawn, are determined for the chip model, for example, the multiple measured values for each parameter. The calculation made by the test system preferably determines a test frequency ($F_1$) for the chip being tested using equation (1) as follows:

$$F_t = (F_s \cdot M + B) + ([T_s - (T_{ja} \cdot (P_{wt} - P_m))] - T_t) \cdot FTS \qquad (1)$$

Where:

$F_s$ is a specified operating frequency for the chip model;

M is the slope of correlation between the test system data for the chip model and specified operating frequencies for the chip model;

B is the offset for the test system data for the chip model to specified operating frequency correlation;

$T_s$ is the junction temperature for a worst case power situation, e.g., a value scaled to insure required quality, with a worst case incoming air temperature and worst case thermal resistance, which is the temperature rise between incoming air and junction temperatures per Watt of power that the chip model dissipates;

$T_{ja}$ is the thermal resistance for the chip model;

$P_{wt}$ is the power drawn by a worst case chip for the model (again, a worst case is selected to insure required quality);

$P_m$ is the power drawn measurement of the test system for the chip under test (block 105);

$T_t$ is the junction temperature of the chip under test; and

FTS is the slope of the maximum specified operating frequency as a function of temperature for the chip model.

As a specific example, parameter values for a Hewlett Packard model PA-8700 processor chip can be:

$F_s$=750 Mega Hertz (MHz);

M=0.9777;

B=13.5 MHz;

$T_s$=90° C.;

$T_{ja}$=0.8° C./Watt;

$P_{wt}$=50 Watts;

$P_m$=38 Watts, which, for this calculation is selected as an average between the $P_{wt}$ of 50 watts and a 27 watt low power level for this chip model;

$T_t$=70° C.; and

FTS=1.81 MHz/C.°.

For this example, the calculated test frequency according to block 106 of the test system is 765.07 MHz for a chip that must operate in a chip purchaser application at 750 MHz. This 765.07 MHz test frequency is lower than what previously would have been used as the test frequency for a chip drawing 38 watts of power.

Prior to the present invention, test frequencies were calculated using operating parameter values for the chip model and not for any particular chip being tested. Individual measurements of power drawn for tested chips were not made to calculate test frequencies. Prior determined tested frequencies were calculated using equation (2) as follows:

$$F_t = (F_s \cdot M + B) + (T_s - T_t) \cdot FTS \qquad (2)$$

In the case of the example set out above, the test frequency calculated using equation (2) is 782.45 MHz, which is 17.38 MHz higher than the test frequency calculated using equation (1).

The present invention using a test system results in having more chips (except for those that operate at or near worst case high power values) tested at lower test frequencies while still insuring that successfully tested chips are fast enough to effectively operate at previously specified operating frequencies. For example, when the thermal resistance ($T_{ja}$) and the difference between worst case power ($P_{wt}$) and measured power ($P_m$) for a chip collectively increase, the test frequency for that chip as calculated using the present invention decreases. It is only for chips that draw power at or near worst case high power values that the present invention does not provide lowered test frequencies.

Being able to use decreased test frequency values, means that an increased numbers of chips can be identified as being capable of operating at specified parameter values in chip purchaser applications. Furthermore, this means that prior specified operating parameter values for chip purchaser applications can be increased, while preserving the percentage of chips tested as being fast enough to be within the revised values.

The maximum operating frequency for a chip can be exceeded when there is a failure over the chip speed path. This circumstance is taken into account by the present invention in that the calculation includes:

i) determination of thermal rises between ambient air temperatures for chip purchaser applications and junction temperatures; and ii) correlation between power drawn measurements specified for the chip model and actual power drawn measurements for the chip being tested.

These results are then combined with the slope of the chip maximum operating frequency as a function of temperature.

Referring again to FIG. 1, a series of frequency and voltage values, i.e., test points, are then used by the test system to test the chip in order to confirm that it will correctly function for the set of operating parameter values specified for the chip model (block 107). The test points range from low to high, for frequencies and voltages, or vice versa. The test system, in addition to utilizing the test frequency calculated using equation (1), also utilizes this range of voltages and frequencies to confirm that a tested chip will properly operate over a specified full operating range. The test results are logged in a database for the chip being tested (block 108) and depending on measured test results a chip is categorized in bins, e.g., as being fast or slow, or some other set of performance levels (block 109).

Figure 2:
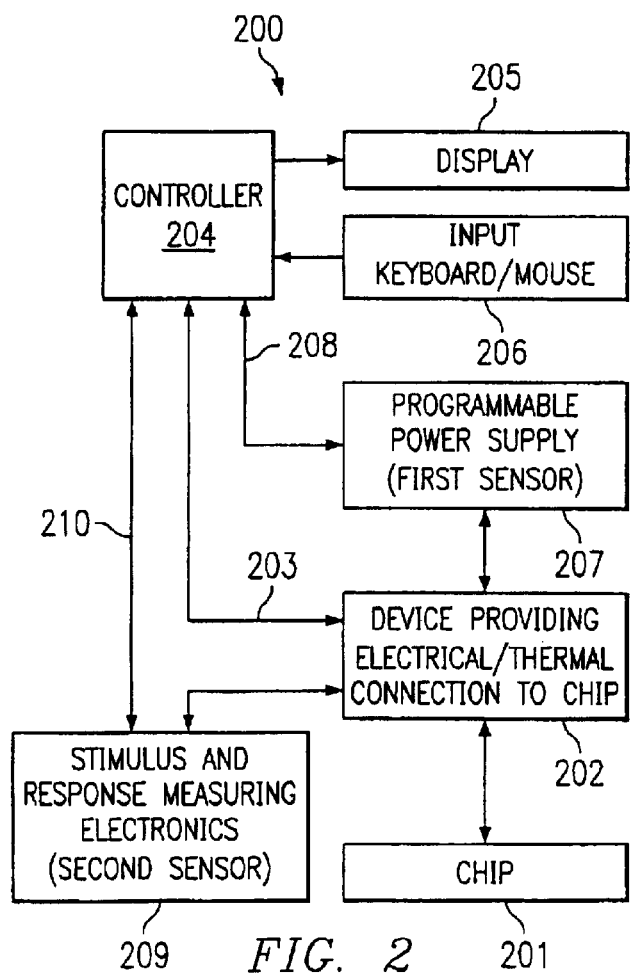
FIG. 2 shows a block diagram for a hardware chip test system according to an embodiment for the invention; and, FIG. 3 is a graph showing frequency (speed) and power data for tested chips according to an embodiment of the present invention.

FIG. 2 depicts, a block diagram for an embodiment of test hardware 200 for the invention. Chip 201 is the chip under test, which can be a separately packaged chip, or a selected chip, or die on a semiconductor wafer. Chip 201 is manually or automatically positioned on device 202 with both electrical and thermal connections, so electrical signals and thermal energy can be provided to and from chip 201. Additionally, device 202, which can include a socket (not shown) for connecting to packaged chips, or a chuck or other type holder for retaining and connecting to chips or die on semiconductor wafers (not shown), includes a temperature control unit used to bring and maintain chip 201 at pre-selected temperatures. Signals for directing operation of device 202 temperature control unit and for identifying chip 201 temperatures are conducted using line 203 from and to controller 204, which can be a computer, e.g., a Hewlett Packard Model HP C3600. Connected to controller 204 are display 205 and input 206, which can include a combination of keyboard and mouse. Controller 204 is used to direct operation of programmable power supply 207, which in addition to being used to energize chip 201 with pre-selected power values, including those used to test chip 201 for connectivity and shorts, also measures the power drawn by chip 201. The power drawn measurements are provided from a first sensor at programmable power supply 207 to controller 204 using line 208. These power drawn measurements and parameter values for the chip model input to controller 204 are used with equation (1) to calculate test frequencies ($F_t$). Controller 204 directs operation of stimulus and response measuring electronics 209 to provide chip 201 with test frequency ($F_t$) and also a series of pre-selected frequencies in order to test chip 201 to determine its predicted performance over a range of specified chip model parameter values. Controller 204 also directs stimulus and response measuring electronics 209 to provide chip 201 with a series of digital or analog inputs. In conjunction with these inputs to stimulus and response measuring electronics 209, controller 204 also directs programmable power supply 207 to provide chip 201 with associated test voltages. A second sensor in stimulus and response measuring electronics 209 can use programmable receivers to measure responses of chip 201 to provided stimulus frequencies and voltages, and can use line 210 to provide controller 204 with measurements of chip 201 performance. Such measured responses for chip 201 provided to controller 204 using line 210 can be stored by controller 204 in a memory device and then be provided to a comparator to characterize the chip according to stored measured speeds.

Figure 3:
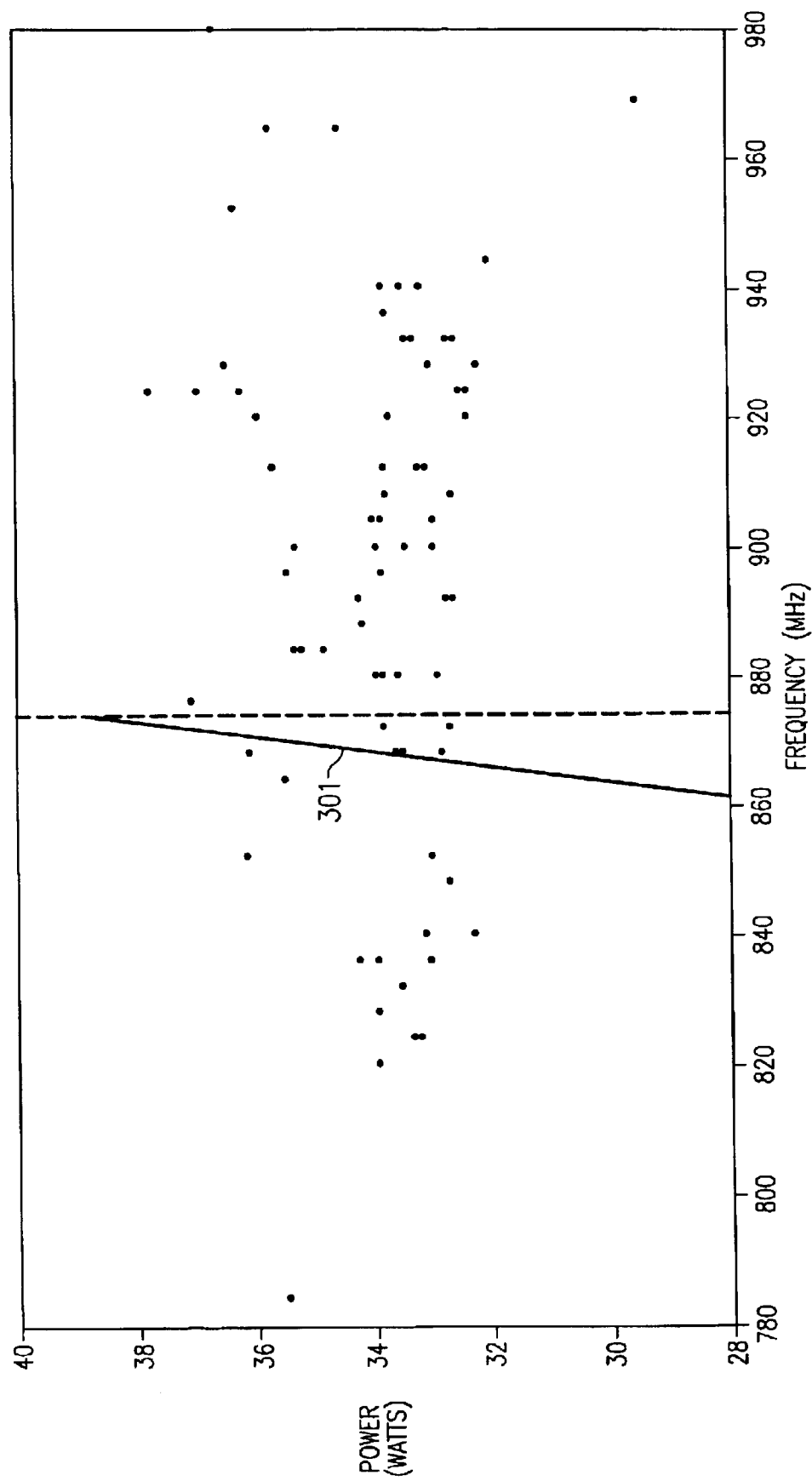

Consequences of using the test system are shown in FIG. 3 where test results for Hewlett Packard model PA-8700 processor chips are shown in terms of chip drawn power at a fixed voltage and frequency versus determined maximum operating frequency. In this case, the prior low cut off frequency for "fast chips" was set at 874 MHz. Using the test system with equation (1) the low cut off frequency for "fast chips" is shifted to frequencies below 874 MHz when drawn power is below 39 Watts, which is below the worst case high power value of 40 watts. This shifted lowered cut-off frequency is shown in FIG. 3 by line 301. The data shown in FIG. 3 has a 72% chip yield for "fast chips" using prior test regimens versus a 79% chip yield for "fast chips" using the current test system, which is a seven percent increase in chip yield for the same specified operating parameter values.

What is claimed is:

1. A method for testing a chip, comprising:
   measuring power drawn by the chip;
   calculating a test frequency using the measured power drawn by the chip (Pm), thermal resistance for the chip model (Tja) and power drawn by a worst case chip for the chip model (Pwt); and
   determining performance of the chip at the calculated test frequency.

2. The method of claim 1 further comprising:
   testing the chip over a range of voltages and frequencies; and
   characterizing the chip according to test results of the testing.

3. The method of claim 1, wherein the calculating a test frequency further comprises:
   determining a frequency at which the chip model specifies (Fs);
   determining a slope of correlation between test data for chips of a model for the chip being tested and operating frequencies for the chip model (M);
   determining an offset between test data for the chip model and specified operating frequency correlation (B);
   determining a chip model function temperature (Ts);
   determining junction temperature of the chip (Tt); and
   determining a slope of maximum operating frequency as a function of temperature for the chip model (FTS).

4. The method of claim 3, wherein the calculating a test frequency further comprises:
   performing computation according to (Fs·M+B)+([Ts−(Tja·−(PWT−Pm))]−Tt)·FTS.

5. The method of claim 3, wherein the chip model junction temperature (Ts) is a temperature for a worst case power situation with worst case incoming air temperature and worst case thermal reference.

6. The method of claim 1 further comprising:
   bringing the chip to a predetermined temperature.

7. The method of claim 1 further comprising:
   checking the chip for shorts and continuity of connections.

8. The method of claim 1 further comprising:
   powering up the chip.

9. The method of claim 1 further comprising:
   applying a reset signal to the chip.

10. The method of claim 1 further comprising:
    testing the chip over a range of voltages and frequencies;
    entering test results data in a database; and
    characterizing the chip according to test results.

11. A method for testing a chip, comprising:
    measuring power drawn by the chip;
    calculating a test frequency calculating a test frequency comprising:
       determining a frequency at which the chip must operate (Fs);
       determining a slope of correlation between test data for chips of a model for the chip being tested and operating frequencies for the chip model (M);
       determining an offset between test data for the chip model and specified operating frequency correlation (B);
       determining a chip model junction temperature (Ts);
       determining a junction temperature of the chip (Tt); and,
       determining a slope of maximum operating frequency as a function of temperature for the chip model (FTS); and
       determining performance of the chip at the calculated test frequency.

12. The method of claim 11 wherein the calculating a test frequency further comprises:
    determining a thermal resistance for the chip model (Tja);

determining a power drawn by a worst case chip for the chip model (Pwt); and determining a measured power drawn by the chip (Pm);

13. The method of claim 12 wherein the calculating a test frequency further comprises:

performing computations according to (Fs·M+B)+([Ts−(Tja·(PWT−PM))]−Tt)·FTS.

14. The method of claim 11 further comprising:

testing the chip over a range of voltages and frequencies; and characterizing the chip according to test results of the testing.

15. The method of claim 11 wherein the chip model junction temperature (Ts) is a temperature for a worst case power situation with a worst case incoming air temperature and worst case thermal resistance.

16. The method of claim 11 further comprising:

bringing the chip to a predetermined temperature.

17. The method of claim 11 further comprising:

checking the chip for shorts and continuity of connections.

18. The method of claim 11 further comprising:

powering up the chip.

19. The method of claim 18 further comprising:

applying a reset signal to the chip.

20. The method of claim 11 further comprising:

testing the chip over a range of voltages and frequencies;

entering test result data in a database; and characterizing the chip according to test results.

21. A method for testing a chip, comprising:

measuring power drawn by the chip;

calculating a test frequency said calculating comprising reducing a chip model junction temperature (Ts) by the product of a thermal resistance for the chip model (Tja) and the difference between a measured power drawn by the chip (Pm) and power drawn by a worst case chip for the chip model (Pwt); and determining performance of the chip at the calculated test frequency.

22. The method of claim 21 wherein the calculating a test frequency comprises:

determines a frequency at which the chip must operate (Fs);

determining a slope of correlation between test data for chips of a model for the chip being tested and operating frequencies for the chip model (M);

determining an offset between test data for the chip model and specified operating frequency correlation (B);

determining a chip model junction temperature (Ts);

determining a junction temperature of the chip (Tt); and, determining a slope a maximum operating frequency as a function of temperature for the chip model (FTS).

* * * * *

UNITED STATES PATENT AND TRADEMARK OFFICE
CERTIFICATE OF CORRECTION

PATENT NO.         : 6,989,684 B2
APPLICATION NO.    : 10/309967
DATED              : January 24, 2006
INVENTOR(S)        : Richard M. Butler It is certified that error appears in the above-identified patent and that said Letters Patent is hereby corrected as shown below:

In column 2, line 31, after "these" insert -- test --.

In column 3, line 25, delete "($F_1$)" and insert -- ($F_t$) --, therefor.

In column 6, line 11, in Claim 3, delete "model specifies" and insert -- must operate --, therefor.

In column 6, line 18, in Claim 3, delete "function" and insert -- junction --, therefor.

In column 6, line 19, in Claim 3, after "determining" insert -- a --.

In column 6, line 19, in Claim 3, after "and" insert -- , --.

In column 6, line 25, in Claim 4, delete "computation" and insert -- computations --, therefor.

In column 6, line 26, in Claim 4, delete "(Tja·-(PWT-Pm))" and insert -- (Tja·(PWT-Pm)) --, therefor.

In column 6, line 29, in Claim 5, after "with" insert -- a --.

In column 6, line 30, in Claim 5, delete "reference" and insert -- resistance --, therefor.

In column 6, line 38, in Claim 9, delete "1" and insert -- 8 --, therefor.

In column 6, line 42, in Claim 10, delete "results" and insert -- result --, therefor.

In column 6, lines 47-48, in Claim 11, before "comprising" delete "calculating a test frequency".

In column 7, line 3, in Claim 12, delete "(Pm);" and insert -- (Pm). --, therefor.

UNITED STATES PATENT AND TRADEMARK OFFICE
CERTIFICATE OF CORRECTION

PATENT NO. : 6,989,684 B2
APPLICATION NO. : 10/309967
DATED : January 24, 2006
INVENTOR(S) : Richard M. Butler It is certified that error appears in the above-identified patent and that said Letters Patent is hereby corrected as shown below:

In column 8, line 16, in Claim 22, delete "determines" and insert -- determining --, therefor.

In column 8, line 26, in Claim 22, after "slope" delete "a" and insert -- of --, therefor.

Signed and Sealed this

Eleventh Day of August, 2009

David J. Kappos
*Director of the United States Patent and Trademark Office*